(12) United States Patent  (10) Patent No.: US 8,674,313 B2
Cao et al.                     (45) Date of Patent:     Mar. 18, 2014

(54) X-RAY IMAGE DETECTION DEVICE

(75) Inventors: Hong-guang Cao, Beijing (CN); Zhi-li Cui, Beijing (CN)

(73) Assignee: Shanghai Iray Technology Ltd., Shanghai (CN)

( * ) Notice: Subject to any disclaimer, the term of this patent is extended or adjusted under 35 U.S.C. 154(b) by 0 days.

(21) Appl. No.: 13/498,904

(22) PCT Filed: Dec. 16, 2009

(86) PCT No.: PCT/CN2009/075637
§ 371 (c)(1),
(2), (4) Date: Mar. 28, 2012

(87) PCT Pub. No.: WO2011/035513
PCT Pub. Date: Mar. 31, 2011

(65) Prior Publication Data
US 2012/0181439 A1    Jul. 19, 2012

(30) Foreign Application Priority Data
Sep. 28, 2009 (CN) .......................... 2009 1 0093787

(51) Int. Cl.
*G01T 1/20* (2006.01)
*H01L 27/146* (2006.01)

(52) U.S. Cl.
USPC ..................................... 250/366; 250/370.09

(58) Field of Classification Search
USPC ................. 250/370.01, 370.09, 370.14, 366; 378/98.9
See application file for complete search history.

(56) References Cited

U.S. PATENT DOCUMENTS

| 7,724,874 | B2 * | 5/2010 | Kameshima et al. | 378/98.12 |
| 7,953,207 | B2 * | 5/2011 | Ohta et al. | 378/98.9 |
| 2006/0237656 | A1 | 10/2006 | Ishii et al. | |
| 2008/0068516 | A1 | 3/2008 | Mori et al. | |
| 2009/0134336 | A1 | 5/2009 | Takahashi | |

FOREIGN PATENT DOCUMENTS

| CN | 03111635.3 | 11/2003 |
| CN | 20058000226.4 | 7/2005 |
| CN | 200610025391.8 | 10/2007 |
| CN | 101106659 A | 1/2008 |
| CN | 200710152862.6 | 3/2008 |
| CN | 200680016705.6 | 5/2008 |
| CN | 200710000874.7 | 7/2008 |
| CN | 200810176704.9 | 5/2009 |
| CN | 100510725 C | 7/2009 |

* cited by examiner

*Primary Examiner* — David Porta
*Assistant Examiner* — Faye Boosalis

(57) ABSTRACT

An X-ray image detection device includes a scintillator, a data integration processing unit and a plurality of X-ray image sensors. The X-ray image sensors are arranged in a matrix form and located on the back of the scintillator and connected to the data integration processing unit. Each X-ray image sensor includes a plurality of pixels, and each pixel has a dual driving pixel structure and includes two thin film transistors and two thin film photodiodes. The source electrodes of the thin film transistors are connected to the cathodes of the thin film photodiodes respectively, and the gate electrodes are connected to an odd row driving line and an even row driving line respectively, and the drain electrodes are connected to a common signal output line. Both anodes of the two thin film photodiodes are connected to a common ground wire of the pixels.

13 Claims, 6 Drawing Sheets

X-RAY IMAGE DETECTION DEVICE

FIELD OF THE INVENTION

The present invention relates to an X-ray image detection device, and more particularly to an image detection device, in which an X-ray is used to detect an internal structure of a substance, a thin film transistor array is used to receive a visible light converted from the X-ray, charges generated by thin film photodiodes are measured one by one and image recovery processing is performed to obtain a two-dimensional image, which belongs to the field of X-ray digital radiography detection.

BACKGROUND OF THE INVENTION

It is well known that X-rays are capable of penetrating substances, and different substances absorb X-rays to different degrees. With the penetrating characteristic and fluorescent characteristic, X-rays may be used to detect an internal structure of an object. Currently, in practice, X-ray detection technologies commonly use film-based photography. Film-based photography offers high imaging quality, and can provide reliable information about a real situation of defects in the object under test correctly. However, it has disadvantages of complex operation process, high running cost, difficulty in storing results and inconvenience to query and carrying.

To solve the above problems, in the 1990s, an X-ray digital radiography detection technology was developed. The basic principle of the X-ray digital radiography technology is using a flat panel detector based on amorphous materials. The flat panel detector is formed by a scintillator (mostly adopting cesium iodide or phosphor), a thin film photodiode array and a thin film transistor array. After an incident X-ray reaches and is absorbed by the scintillator, a visible light is excited and transmitted to a photodiode at a lower layer, converted into an electrical signal, which is integrated in the thin film transistor to become stored charges, and the stored charges are transmitted to a peripheral circuit in sequence as triggered by a control circuit, subjected to amplifying processing by an amplifier after data readout, and converted into a binary digital signal, which is transmitted to and displayed on a console through a cable. As images of an X-ray digital radiography system are formed by digital pixels, and have advantages of high spatial resolution, high image fidelity and large black and white dynamic range, almost the same imaging quality and resolution as that of film-based photography can be achieved, and meanwhile, processing of the images using a computer is facilitated.

The X-ray digital radiography system based on the flat panel detector has a broad vista of applications in nondestructive inspection and evaluation, container scanning, circuit board inspection, and medical applications. Chinese Patent (or Patent Application) Nos. 200580002226.4, 03111635.3, 200710152862.6, 200680016705.6, 200710000874.7, 200610025391.8 and 200810176704.9 introduce wide application of X-rays in medical imaging, nondestructive inspection of industrial products, structural detection of a living body, and safety inspection respectively. As for this, reference may be made to application documents of the patents (or patent applications), which will not be detailed herein.

In the X-ray digital radiography technology, the primary technical difficulty is the process of obtaining an image from the thin film transistor array. This process is a process reverse to the imaging principle of a liquid crystal display (LCD). The technical problem to be solved is to adopt a reasonable combination of thin film transistor structures to convert a visible light image into an electrical signal and implement image reconstruction. Currently, there are various technical solutions to imaging, such as linear scanning; however, such existing technologies still have defects of too long exposure time and low spatial resolution.

SUMMARY OF THE INVENTION

A technical problem to be solved by the present invention is to provide an X-ray image sensor. The image sensor is aimed at solving technical difficulties in the above reverse process, so as to simplify the manufacturing process and facilitate the application.

Another technical problem to be solved by the present invention is to provide an X-ray image detection device using the X-ray image sensor.

To achieve the above objectives, the present invention adopts the following technical solution.

An X-ray image sensor includes a plurality of pixels, each of which has a dual driving pixel structure, where:

each pixel includes two thin film transistors which are odd and even respectively and two thin film photodiodes;

source electrodes of the two thin film transistors are connected to cathodes of the two thin film photodiodes respectively, gate electrodes are connected to an odd row driving line and an even row driving line respectively, drain electrodes are connected to a common signal output line, and the signal output line is connected to a charge readout circuit; and both anodes of the two thin film photodiodes are connected to a common ground wire of the pixels.

The charge readout circuit obtains signals when the thin film transistor is in an off state and an on state, which are stored in a reference charge register and a signal charge register respectively; and a signal difference between the reference charge register and the signal charge register is input to an analog-to-digital conversion circuit.

A row driving control circuit controls on and off of the thin film transistor, and at the same time controls signal storage and output of the reference charge register and the signal charge register.

The X-ray image sensor further has a multiple signal output selecting switch, the multiple signal output selecting switch is controlled by the row driving control circuit, and charges on different pixels are discharged to the same signal output line through switching of the switch.

The row driving control circuit is adhered to a glass substrate, the multiple signal output selecting switch is integrated in the row driving control circuit, and row driving signal lines are fabricated to be connected to fingerlike row driving electrodes receiving inputs from the row driving control circuit.

The charge readout circuits are distributed on left and right sides of the X-ray image sensor, and the charge readout circuits on each side are only connected to ½ of a total number of rows of the pixels.

An X-ray image detection device includes a scintillator for converting an X-ray into a visible light, and a data integration processing unit, where:

the X-ray image detection device further includes a plurality of the X-ray image sensors, and the X-ray image sensors are arranged in a matrix form; and the scintillator is directly opposite to an X-ray source, the X-ray image sensors arranged in the matrix form are located on the back of the scintillator, and the data integration processing unit is connected to the X-ray image sensors.

The X-ray image detection device further includes an X-ray dose sensor, and the X-ray dose sensor is located on the back of the X-ray image sensor.

The X-ray dose sensor generates a feedback signal through an X-ray dose feedback output unit, and the feedback signal is provided to the X-ray source.

The X-ray image detection device is activated at the moment when the X-ray dose sensor starts to accumulate charges, and the pixel charge accumulation of the X-ray image detection device is ended at the moment when the X-ray dose sensor meets dose requirements.

The X-ray image detection device further includes an anti-scatter grid, the anti-scatter grid is directly opposite to the X-ray source, and the scintillator is located on the back of the anti-scatter grid.

The anti-scatter grid may be replaced by a virtual grid.

The X-ray image detection device provided in the present invention may be manufactured by an existing LCD manufacturing process, which greatly reduces the manufacturing cost. The X-ray image detection device can obtain full digital X-ray images having a short exposure time and a high spatial resolution, and provide powerful technical supports for the applications such as nondestructive inspection of industrial products and realization of visible minimally invasive surgery.

BRIEF DESCRIPTION OF THE DRAWINGS

The present disclosure will become more fully understood from the detailed description given herein below for illustration only, and thus are not limitative of the present disclosure, and wherein.

DETAILED DESCRIPTION OF THE PREFERRED EMBODIMENTS

The basic idea of the present invention is to use a thin film transistor array to receive a visible light converted from an X-ray by a scintillator. The thin film transistor array and a thin film photodiode array jointly form a flat panel detector. As the intensity of the visible light changes, different charges are generated on thin film photodiodes. The charges of the thin film photodiodes are measured one by one through opening and closing of thin film transistor array switches so as to obtain changes in the degree of X-ray absorption, thereby obtain a set of two-dimensional image data. Based on this, data required for recovering a static two-dimensional image and a dynamic two-dimensional image may be obtained, and details of the images are restored through image recovery computation.

Figure 1:
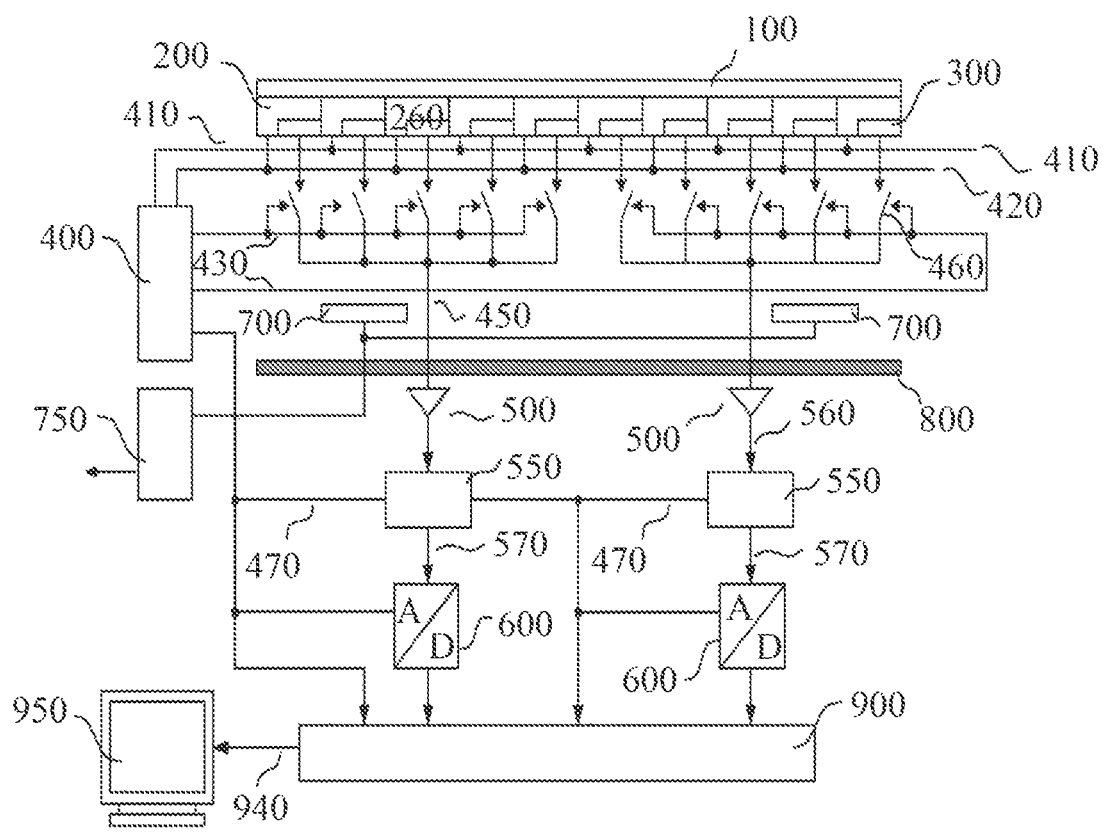
FIG. 1 is a block diagram of the general electrical principle of the present invention.

FIG. 1 is a block diagram of the general electrical principle of an X-ray image detection device provided in the present invention. The X-ray image detection device 1000 is formed by a scintillator 100 for converting an X-ray into a visible light, thin film photodiodes 200 and a thin film transistor array 300 which are obtained by a semiconductor manufacturing process and arranged in a matrix form, a row driving control circuit 400 for controlling a photoelectric conversion component group to work in a coordinated manner, charge readout circuits 500 for reading photoelectric converters, an analog-to-digital conversion circuit 600 for converting the charges into data, an X-ray dose sensor 700 and an X-ray dose feedback output unit 750, an X-ray protective layer 800 for protecting electronic circuits, a data integration processing unit 900 having data acquisition and processing functions, and a computer system 1300 for recovering signals of the photoelectric components. The X-ray image detection device 1000 may be used to obtain image data of the degree of X-ray absorption of an object to be detected at a specific two-dimensional coordinate position, and the image data is stored, transmitted and recovered into readable images on the computer system 1300, which are displayed on an image display 950. The recovered images may be static or continuous dynamic images, and may be applied to nondestructive industrial inspection, observation and examination of the anatomical structure of the human body and other occasions using X-ray for analysis.

Figure 2:
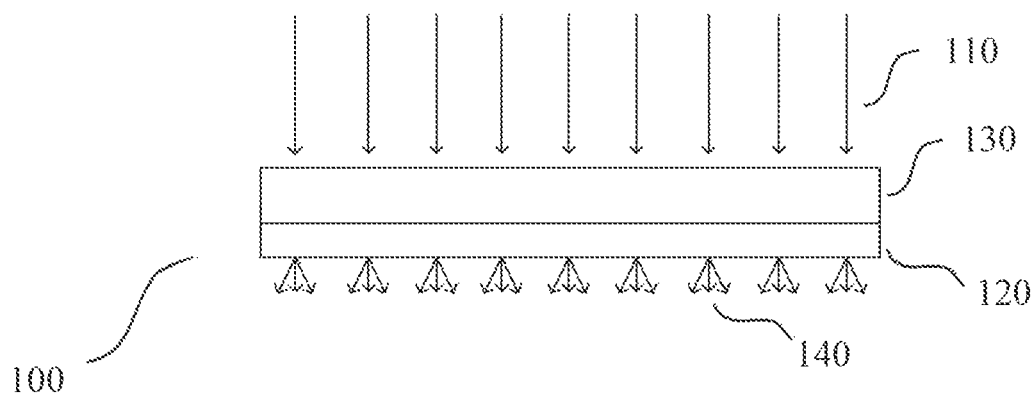
FIG. 2 is a schematic structural view of an X-ray excited light emitting scintillator.

FIG. 2 is a schematic structural view of an X-ray excited light emitting scintillator used in the present invention. The scintillator 100 is made of a material such as thallium doped cesium iodide or gadolinium oxysulfide. The outermost layer of the scintillator 100 is a thin slab 130 made of amorphous carbon or carbon fiber, which is 0.5 to 3 mm thick, and thus blocks a small amount of X-rays. A vertically arranged scintillator group 120 is disposed below the thin slab 130. The scintillator group 120 is vertically arranged, considering that the transmission efficiency of light is the highest in the vertical direction, an array formed by thin film photodiode structures 210 in the vertical direction can obtain maximum light, and the interference with neighboring thin film photodiodes is minimal. During manufacturing of a flat panel detector, the scintillator 100 needs to be closely attached to thin film photodiodes. Methods of attachment include pressure attachment, negative pressure vacuum adsorption, adhesion via a light transmissive adhesive, and direct growth or coating of a scintillation material on the thin film photodiode group.

Figure 3:
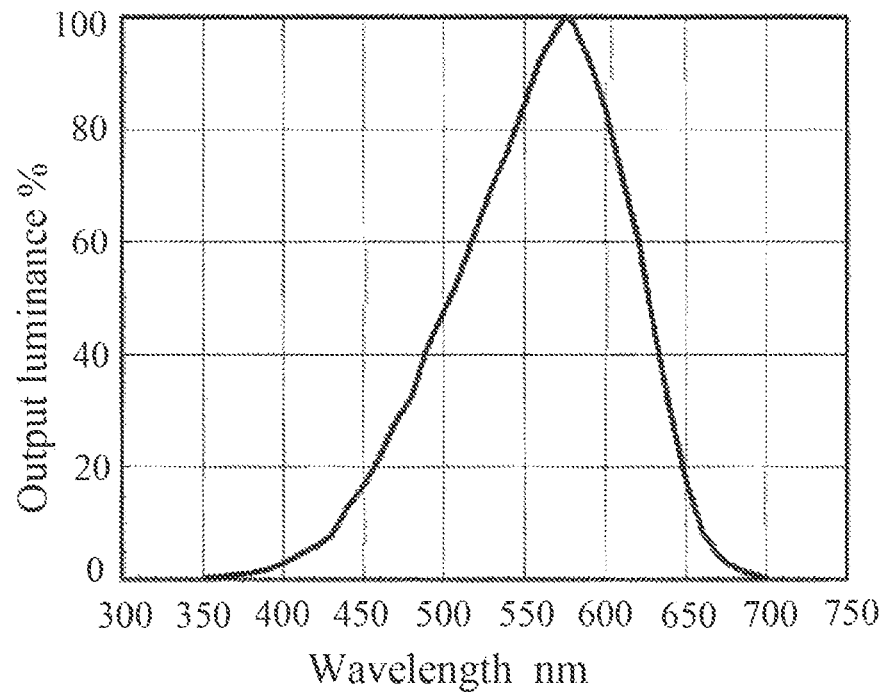
FIG. 3 is a distribution graph of wavelength characteristics of light emitted by a scintillator.

When an incident X-ray 110 from the outside is projected on the scintillator 100, actually most of the incident X-ray 110 is blocked and absorbed by the vertically arranged scintillator group 120, and converted into a visible light 140. As shown in FIG. 3, the visible light 140 converted from the incident X-ray 110 on the scintillator 100 has a peak wavelength of 530 to 580 nm, and the spectral range may be from 350 to 700 nm.

The light has a quite short delayed effect, and may be attenuated to below 1% of the brightness of the X-ray within 1 ms after the X-ray disappears.

An X-ray image sensor (briefly referred to as image sensor) 1050 provided in the present invention adopts a unique odd/even dual driving pixel 350. Each row of pixels is controlled by an odd row driving line 410 and an even row driving line 420 in an odd/even manner, every two columns of pixels share one signal output line 450 and one charge readout circuit 500, and therefore, the number of the signal output line 450 is ½ of the number of columns of pixels. The number of driving lines is 2 times the number of rows of pixels, and the driving lines control, on two sides of the image sensor 1050, odd thin film transistors 330 and even thin film transistors 320 respectively.

Figures 4A, 4B:
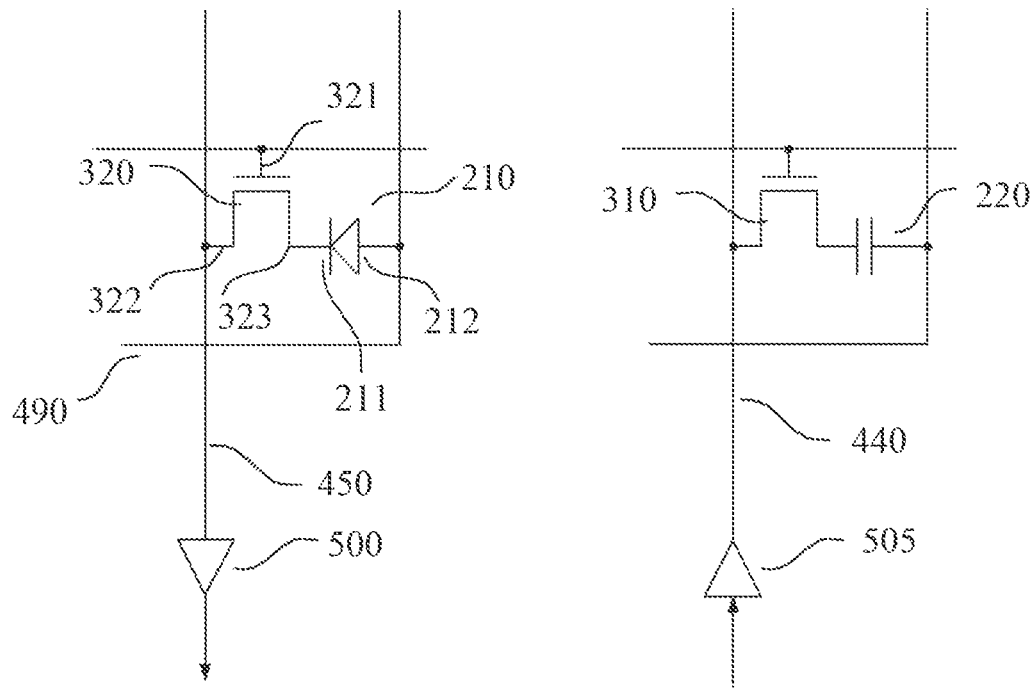
FIG. 4(a) and FIG. 4(b) show a single pixel circuit structure in the present invention and a single pixel circuit structure used in an LCD display respectively.

FIG. 4(a) and FIG. 4(b) show a single pixel circuit structure in the present invention and a single pixel circuit structure used in an LCD display respectively. Different from a luminance driving circuit 505 in an LCD display application, in the pixel circuit structure of the present invention, the current direction on the signal output line 450 is opposite to the current direction on a luminance signal driving line 440 in the LCD display application. In addition, different from a thin film transistor structure 310 in the LCD display application, source electrodes 323 of the thin film transistors 320 and 330 in the image sensor 1050 are connected to the thin film photodiode structures 210, and drain electrodes 322 are connected to the signal output line 450.

As shown in 4(a), charges are generated on the thin film photodiode structures 210 that receive the visible light photons. The thin film photodiode is formed by two electrodes, where an anode 212 of the thin film photodiode is equivalent to the anode of an ordinary photodiode, and is connected to a common ground wire 490 of the pixels; a cathode 211 of the thin film photodiode is equivalent to the cathode of an ordinary photodiode, and is connected to the source electrode 323 of the thin film transistor. Before charges accumulate, a negative bias of −1 to −12 V is loaded on the thin film photodiode through the common ground wire 490 of the pixels.

Figures 5A, 5B:
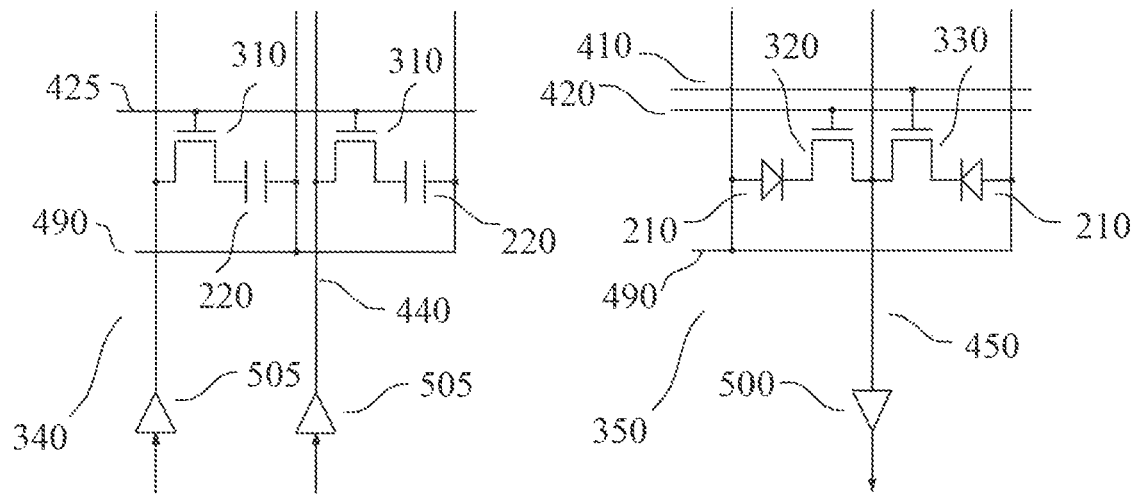
FIG. 5(a) and FIG. 5(b) show a pixel structure used in an LCD display and a unique dual driving pixel structure in the present invention respectively.

FIG. 5(a) and FIG. 5(b) show a pixel structure used in an LCD display and a unique dual driving pixel structure in the present invention respectively. Different from a single driving pixel 340 in the LCD display application, driving of the image sensor in the present invention requires two driving pixels to work together. In addition, different from pixel capacitors 220 in the LCD display application, the image sensor in the present invention actually does not have the pixel capacitors 220, but instead, have the thin film photodiode structures 210.

As shown in FIG. 5(b), when gate electrodes 321 of the thin film transistors 320 and 330 are at a negative bias, a high resistance state is presented between the source electrodes 323 and the drain electrodes 322. When the gate electrodes 321 of the thin film transistors are loaded with a positive bias, the source electrodes 323 and the drain electrodes 322 of the thin film transistors 320 and 330 present a low resistance state. In this way, the charges generated after the thin film photodiodes receive the photons may be discharged to the signal output lines 450 through the source electrodes 323 and the drain electrodes 322 of the thin film transistors. The signal output line 450 is connected to the external charge readout circuit 500.

Figure 6:
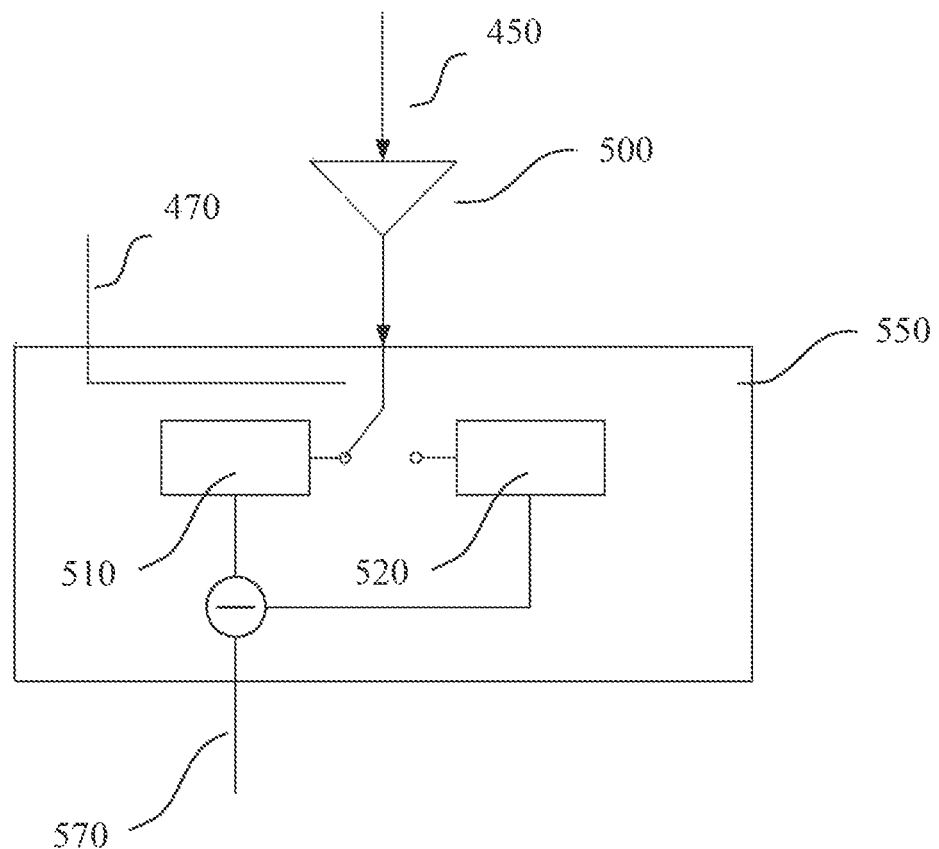
FIG. 6 illustrates a unique structure having two charge registers and a differencing circuit in the present invention.

As shown in FIG. 6, the charge readout circuit 500 converts the quantity of the charges into a voltage, which is transmitted to a charge difference collector 550 through an output signal line 560 of the charge readout circuit, and a charge difference signal 570 is transmitted to the analog-to-digital conversion circuit 600. The charge difference collector 550 is a differencing circuit. The charge readout circuit 500 may obtain signals when the thin film transistor is in an on state and an off state respectively, which are stored in a reference charge register 510 and a signal charge register 520 respectively. Signal storage and output in the two registers are controlled by the row driving control circuit 400. A signal difference between the two registers is sent to the analog-to-digital conversion circuit 600. Such an operation mode of two times of sampling and holding followed by differencing can ensure the accuracy of signal detection of the image sensor 1050, so as to avoid the influence of slight differences of the group of the thin film transistors 300 and the group of the thin film photodiodes 200 during manufacturing on signal detection. The charge difference collector 550 works under the control of a switching switch control circuit 470, and sends the obtained charge difference signal 570 during conversion of a mode converter.

Figure 7:
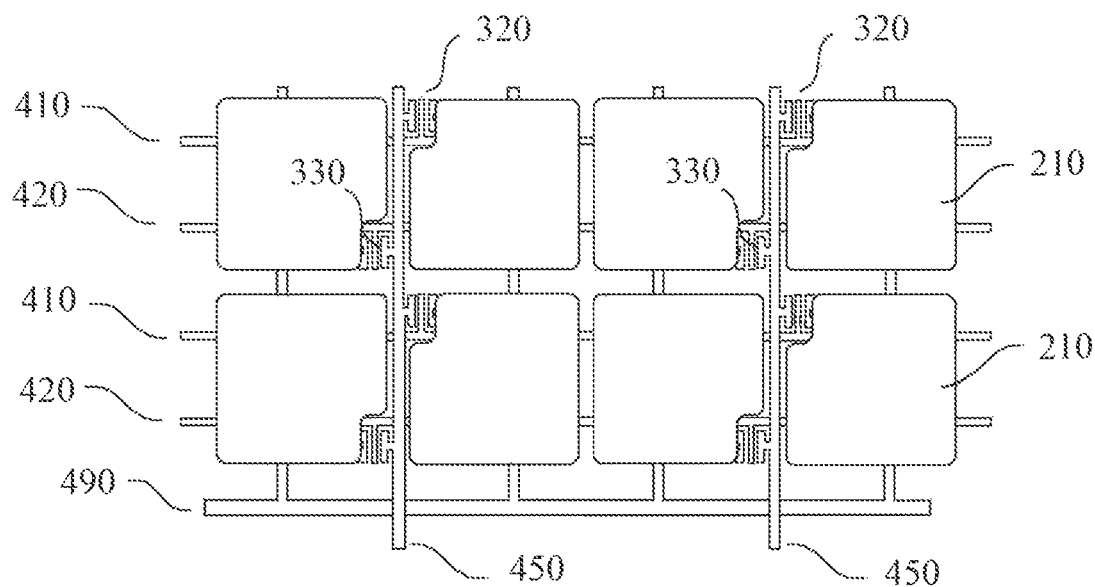
FIG. 7 is a schematic view of pixel structures drawn on a glass substrate in the present invention.

FIG. 7 is a schematic view of dual driving pixel structures drawn on a glass substrate in the present invention. The glass substrate is a conventional component in the flat panel detector, and the details will not be described herein again. Different from a row driving line 425 in the LCD display application, each row of pixels of the image sensor in the present invention is classified into odd and even pixels, which are driven through the odd row driving line 410 and the even row driving line 420 respectively. On and off of the thin film transistors 320 and 330 are controlled by the row driving control circuit 400. When the odd thin film transistor 330 is on, charges on the thin film photodiode structure 210 connected to the odd thin film transistor 330 are discharged to the signal output line 450. When the even thin film transistor 320 is opened, charges on the thin film photodiode structure 210 connected to the even thin film transistor 320 are discharged to the signal output line 450. In the present invention, the effective area of the thin film photodiode structure 210 accounts for most of the area of a pixel 260. Such a design is for the purpose of enabling the visible light converted from the X-ray to be absorbed by the thin film photodiode as much as possible, and to be converted into charges.

Figure 8:
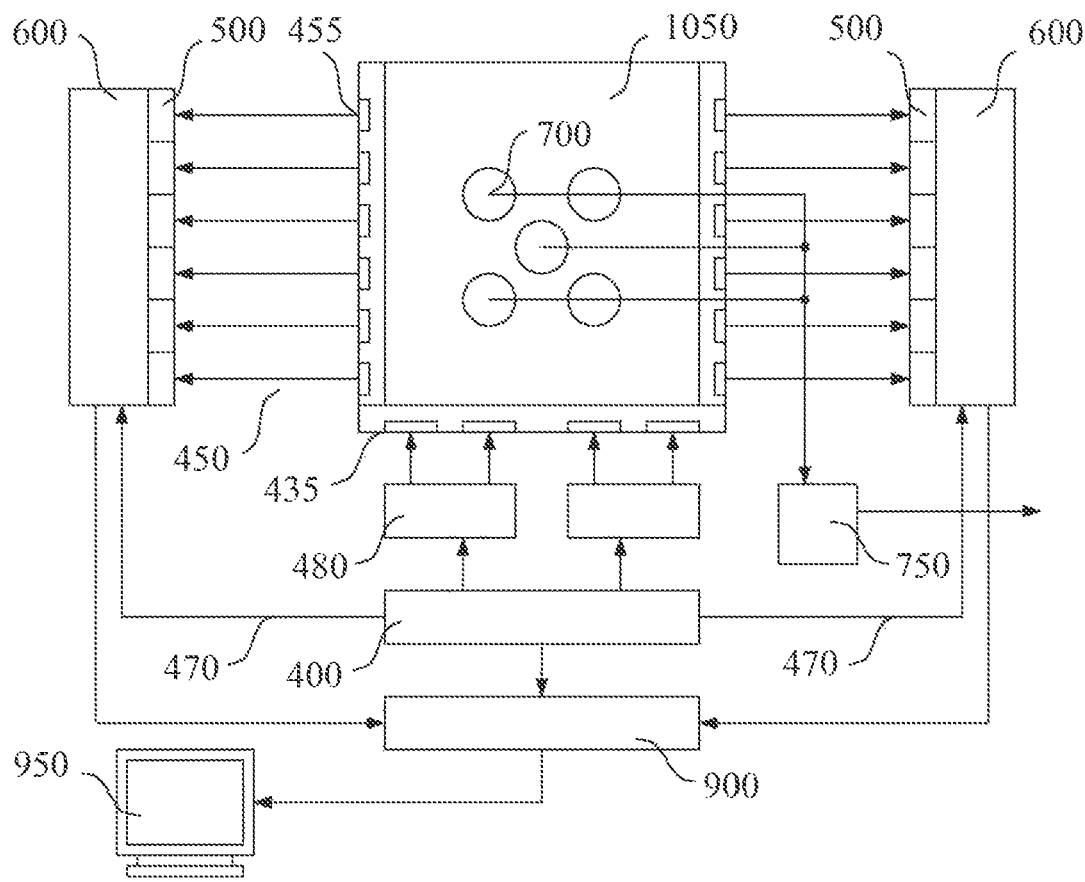
FIG. 8 describes a connection relation between a glass substrate, having a thin film photodiode group and a thin film transistor group, and a peripheral circuit.

As shown in FIG. 8, the analog-to-digital conversion circuit 600 has an accuracy range of 14 to 16 bits. The number of the analog-to-digital conversion circuit 600 included in the image sensor 1050 is the same as or ½ of the number of the charge readout circuit 500, depending on whether a multiplexing switch is additionally disposed at a front end of the analog-to-digital conversion circuit 600 to switch the charge readout circuit 500 corresponding to the analog-to-digital conversion circuit 600. To ensure the accuracy of values output from the analog-to-digital conversion circuit 600, timing of signal acquisition and conversion needs to be controlled by the row driving control circuit 400.

The image sensor 1050 in the present invention is formed by M×N pixels, where M is the number of row driving, and N is 2 times the number of the charge readout circuits. As M and N are often large, a plurality of integrated row-driving-circuit odd/even row controllers 480 and a plurality of the charge readout circuits 500 need to be adopted to control all signals on one image sensor 1050. Timing control of the row-driving-circuit odd/even row controllers 480 is managed and coordinated by the row driving control circuit 400. A plurality of the charge readout circuit 500 chips obtain charges of all pixels in the rows opened by the driving circuit at the same time, which are transmitted to the outside through the analog-to-digital conversion circuit 600. A plurality of paths of data needs to be combined into one path of data through a plurality of bus data controllers 610. Data of odd rows and even rows is finally combined into an image frame signal by the data integration processing unit 900, which is sent to the computer and played back by the image display 950. In a specific embodiment of the present invention, a readout chip may be integrated with 2N charge readout circuits 500, where N is an integer between 6 and 9. Definitely, N may also be other positive integers.

A multiple signal output selecting switch 460 fabricated on the image sensor 1050 is controlled by the row driving control circuit 400, and charges on different pixels 260 may be discharged to the same signal output line 450 through switching of the switches. Such a multiple signal output selecting switch 460 may enable a plurality of columns of pixels to share one charge readout circuit 500, which is a design scheme for ensuring consistent electrical characteristics. What's more, the multiple signal output selecting switch 460 may conveniently discharge charges on a plurality of pixels 260 to the charge readout circuit 500 at the same time, thereby achieving higher sensitivity and saturation. In addition, the multiple signal output selecting switch 460 is also capable of changing the spatial resolution of rows of the image sensor 1050, and may realize combination of K×J pixels 260 in cooperation with a row driving line starting action. The number of switches of the multiple signal output selecting switch 460 is J. J is an integer, with a minimum of 2, and a maximum of ½ of the number of columns. The required number of the charge readout circuit is obtained by dividing the number of columns of pixels of the image sensor 1050 by 2J. K is the number of driving lines that can be started at the same time. A minimum number of pixels 260 that can be combined is 2×2, and a maximum number of pixels 260 that can be combined is K×J. According to requirements in use, K may be not equal to J, so that a non-square pixel 260 may be obtained after combination.

In some occasions requiring observation of dynamic images, the readout speed may be multiplied by combined sampling of the pixels of the image sensor 1050. For the image sensor 1050 having M×N pixels, when sampling is performed using a 2×2 pixel combination mode, the readout speed is nearly 4 times that of the 1×1 pixel readout mode. Such a combined sampling mode is very helpful to dynamic images, theoretically the speed is increased by K×J times, and in practical application, the readout speed may be increased by K×J/2 times.

As shown in FIG. 8, to reduce the resistance and distributed capacitance of signal lines, the charge readout circuits 500 may be distributed on left and right sides of the image sensor 1050, and the charge readout circuits 500 on each side is only connected to ½ of a total number of rows of the pixels. Such a design scheme can reduce the resistance and capacitance of signal lines by half, thereby further improving the signal-to-noise ratio of the image sensor 1050.

Figure 9:
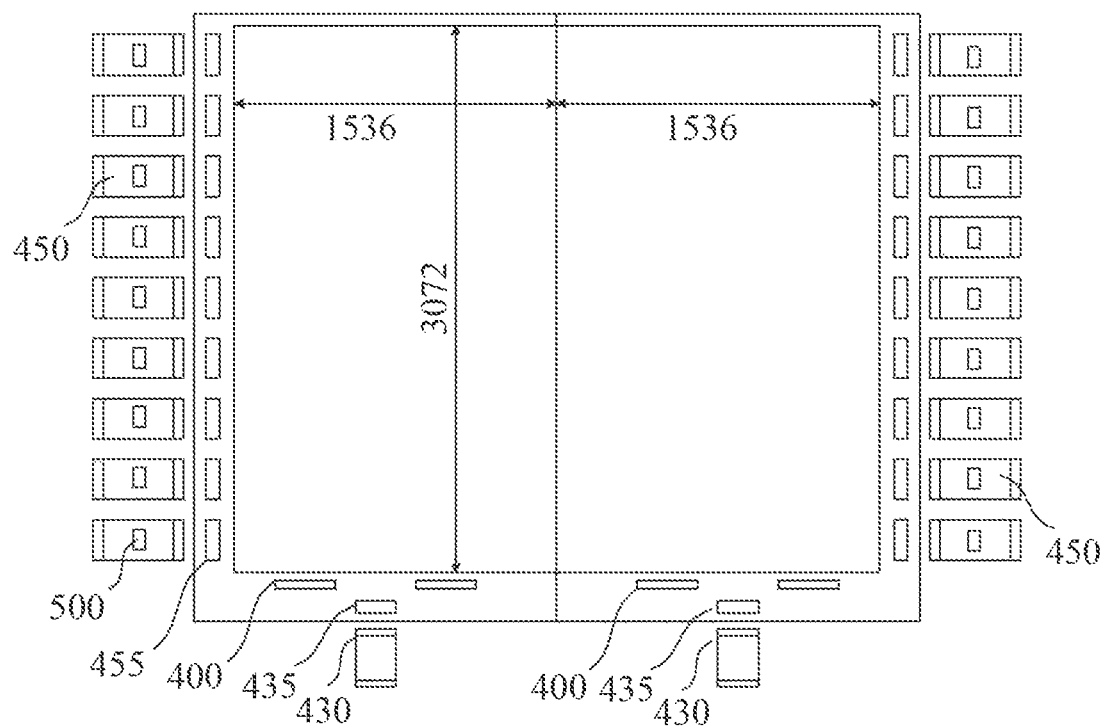
FIG. 9 further describes connection between high-density fingerlike electrodes fabricated on a glass substrate and a flexible circuit board.

As shown in FIG. 9, the image sensor 1050 may have a very high spatial resolution. For example, in an application embodiment shown in FIG. 11, the total number of rows of the image sensor 1050 is 3072, and readout circuits on two sides are connected to 1536 pixels in an upper part and 1536 pixels in a lower part respectively. In this case, the pixel size is very small, and is 50 um to 300 um, and signal lines and driving lines are arranged densely. To achieve good connection with an external circuit, the signal lines are connected to fingerlike signal output electrodes 455 on the image sensor 1050, and the external circuit is interconnected with the image sensor 1050 by the signal output lines 450 made of a flexible circuit board. Such an interconnection is achieved by metal particles and an adhesive. As the driving lines are arranged more densely than the signal lines, the row driving control circuit 400 needs to be adhered to the glass substrate of the image sensor 1050, and the multiple signal output selecting switch 460 is integrated in the row driving control circuit 400. Row driving signal lines 430 made of flexible circuit board are directly fabricated to be connected to fingerlike row driving electrodes 435 receiving inputs from the row driving control circuit 400.

Figure 10:
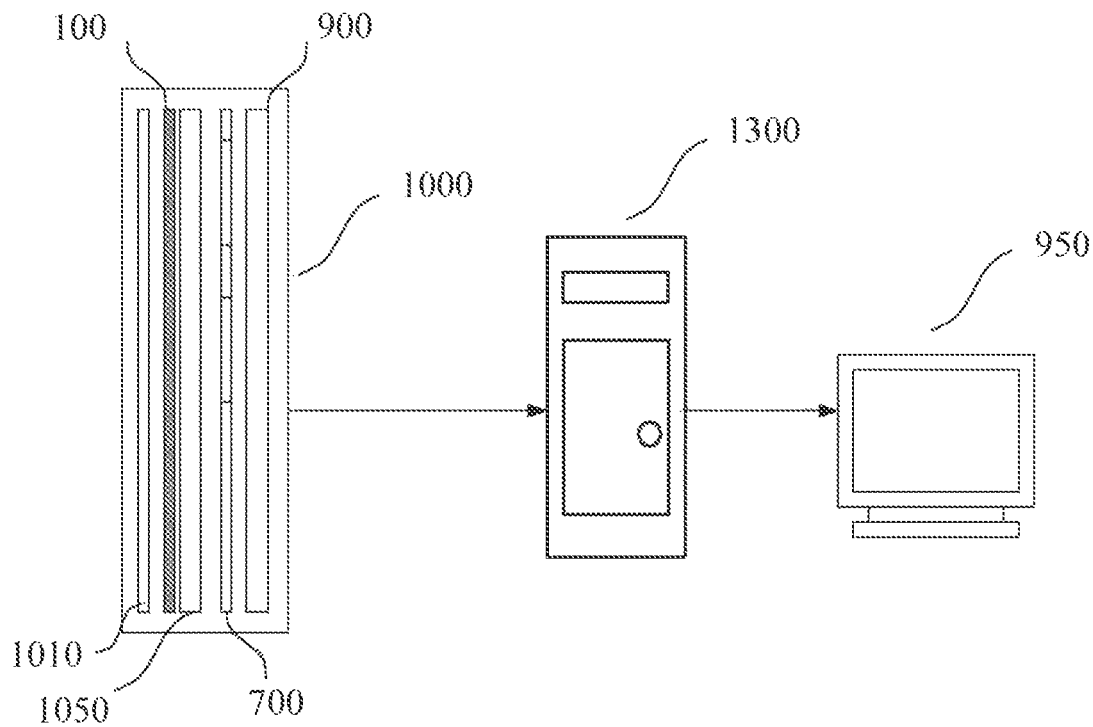
FIG. 10 shows an overall assembly structure of the present invention and an application circuit connection scheme.

As shown in FIG. 10, the X-ray image detection device 1000 provided in the present invention includes an image sensor 1050, an anti-scatter grid 1010 (or a virtual grid, for which reference may be further made to Chinese Patent No. ZL 200610114533.8), a scintillator 100, an X-ray dose sensor 700 and a data integration processing unit 900. Data of the X-ray image detection device 1000 is processed in an image processing computer 1300 and then sent to the image display 950 for playback. Such applications are mainly embodied in the following two implementations. In the present invention, a plurality of X-ray dose sensors 700 may be mounted on the back of the image sensor 1050. The X-ray dose sensor 700 feeds back an X-ray intensity signal to the X-ray dose feedback output unit 750 through a dose control circuit, so as to ensure that the incident X-ray 110 penetrating the object is just suitable for requirements of the detection range. As the flat panel detector in the present invention is quite thin, and the X-ray may easily pass through the flat panel detector, the configuration of the X-ray dose sensor 700 on the back of the pixel group of the image sensor 1050 does not affect imaging. This is also one of the unique features of the present invention.

When the X-ray is emitted, the X-ray dose sensor 700 generates a feedback signal through the X-ray dose feedback output unit 750 according to energy and quantity of quanta of the X-ray. The feedback signal is provided to the X-ray source. When the amount of X-ray irradiation received by the image sensor 1050 meets the requirements of image detection, the X-ray source stops the X-ray irradiation. Through the X-ray dose sensor 700, an effective radiation dose may be controlled, and detection images in an optimal state can be obtained. In practice, all or a part of the X-ray dose sensors 700 may be activated depending on the form of the object to be detected.

The X-ray image detection device 1000 is activated at the moment when the X-ray dose sensor 700 starts to accumulate charges, and the pixel charge accumulation of the X-ray image detection device 1000 is ended at the moment when the X-ray dose sensor 700 meets dose requirements. Specifically, the X-ray source presets a tube voltage and a tube current of the X-ray, and irradiation time is determined based on a feedback signal integral value of the X-ray dose sensor 700. When the feedback signal integral value reaches a threshold, the X-ray source stops the X-ray irradiation. Through such a feedback control mode, the circuit design of the X-ray image detection device may be simplified, while enabling fool-proof operation.

The image sensor 1050 and the corresponding X-ray image detection device 1000 in the present invention may be manufactured by an existing LCD manufacturing process, which greatly reduces the manufacturing cost. This is also one of the remarkable advantages of the present invention.

Figure 11:
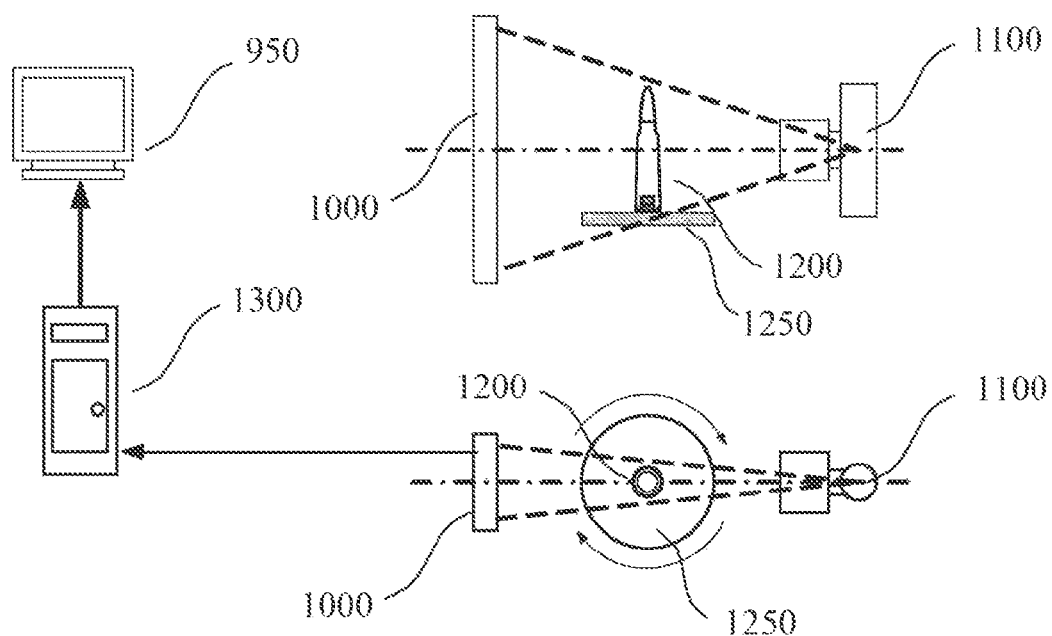
FIG. 11 shows a first application embodiment of the present invention, for observing an internal structure of a non-disassemble military product in a non-destructive manner, where a detailed internal structure of the detected product is obtained by cone-beam Computed Tomography (CT)

FIG. 11 introduces a first application embodiment of the present invention. In this embodiment, the X-ray image detection device may be applied to inspection of a non-disassemblable industrial product, so as to achieve non-destructive inspection of the object to be detected.

An object to be detected 1200 is placed on a rotary table 1250. An X-ray 110 emitted from an X-ray tube 1100 penetrates the object to be detected 1200. The object to be detected 1200 consists of different substances, and the intensity of the X-ray 110 after penetrating the object to be detected changes, which is dependent on the degree of absorption of the X-ray penetrating the object. The X-ray with changed intensity includes internal information of the object to be detected 1200. When this part of the X-ray is projected on a detector 1000, the X-ray 110 is converted by the scintillator group 120 into a visible light image having changing luminance, and the image will be subjected to the above processes and obtained by the image processing computer 1300. As the rotary table 1250 rotates by a certain angle after each X-ray exposure, all internal structure information of the object to be detected 1200 may be obtained after rotation of 180° or 360° is completed in sequence, and a reconstructed structure of the object may be obtained by adopting a cone-beam three-dimensional spatial reconstruction technology.

Figure 12:
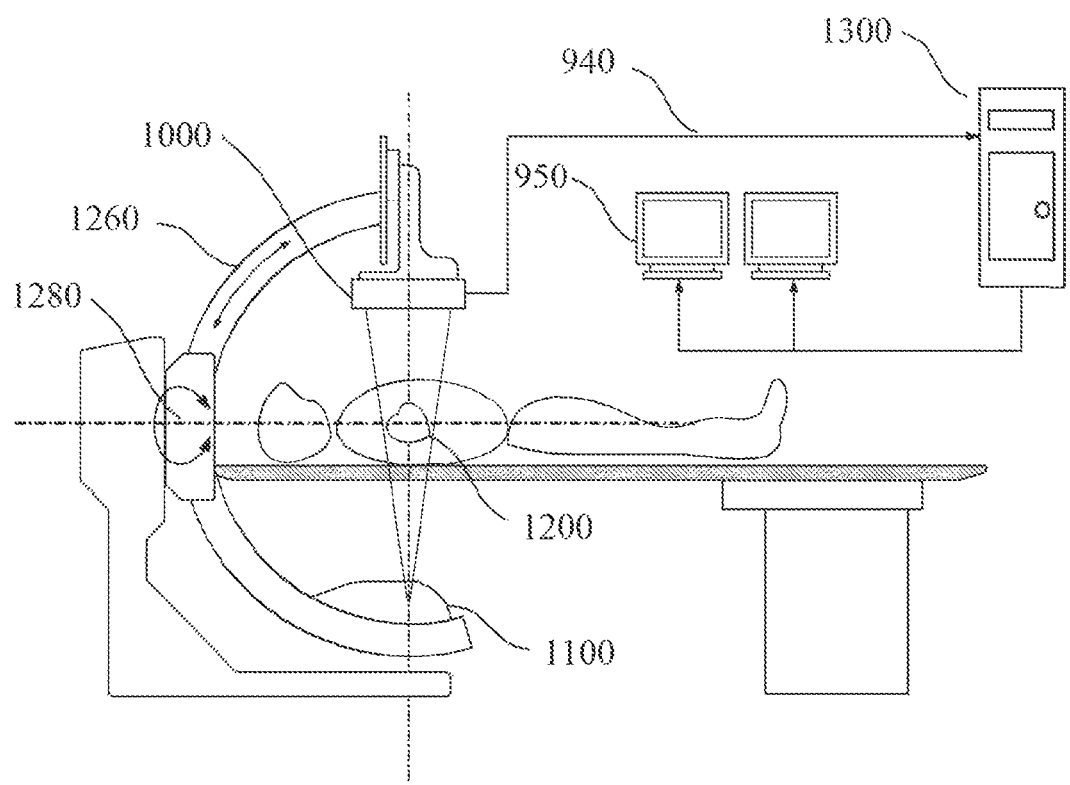
FIG. 12 shows a second application embodiment of the present invention, for observing an active human organ such as a heart in real time during an interventional surgery.

FIG. 12 introduces a second application embodiment of the present invention. In this embodiment, the X-ray image detection device may be applied to a human body for health examination and diagnosis and treatment of diseases, so as to realize visible minimally invasive surgery.

Vital organs such as heart may require minimally invasive surgery due to diseases. Such vital organs may be considered as the object to be detected 1200 described above. After the X-ray tube 1100 emits the X-ray 110, the X-ray 110 penetrates the object to the detected and then reaches the detector 1000, and is subjected to the above processes to obtain a real-time dynamic image. The image not only includes the organ being the object to be detected, but also displays an instrument and an implant placed by the doctor. As the image moves in real time, the doctor may use an instrument to implant an implant into the organ being the object to be detected while observing the image, thereby achieving the objective of treatment. Meanwhile, the angle of the X-ray may be changed to allow observation of the organ 1200 from different directions. Such machines often have a function of rotating along a horizontal axis 1260 of the human body and a function of rotating along a longitudinal axis 1280 of the human body. X-ray transmission images obtained from different angles may be used by the image processing computer 1300 to reconstruct a three-dimensional space, so as to obtain a detailed internal structure of the organ.

The X-ray image sensor and the corresponding X-ray image detection device provided in the present invention have been illustrated in detail above. For those of ordinary skill in the art, any obvious modifications to the present invention without departing from the spirit of the present invention shall be considered as infringement to the patent rights of the present invention, and shall bear corresponding legal liability.

What is claimed is:

1. An X-ray image sensor, comprising a plurality of pixels, each of which has a dual driving pixel structure, wherein:
   each pixel comprises two thin film transistors which are odd and even respectively and two thin film photodiodes;
   one of the two thin film transistors has a source electrode connected to a cathode of one of the two thin film photodiodes, a gate electrode connected to an odd driving line, and a drain electrode connected to a signal output line;
   the other one of the two thin film transistors has a source electrode connected to a cathode of the other one of the two thin film photodiodes, a gate electrode connected to an even driving line, and a drain electrode connected to said signal output line;
   the signal output line is connected to a charge readout circuit; and
   both anodes of the two thin film photodiodes are connected to a common ground wire of the pixels.

2. The X-ray image sensor according to claim 1, wherein:
   the charge readout circuit obtains signals when the thin film transistor is in an off state and an on state, which are stored in a reference charge register and a signal charge register respectively; and a signal difference between the reference charge register and the signal charge register is input to an analog-to-digital conversion circuit.

3. The X-ray image sensor according to claim 2, wherein:
   a row driving control circuit controls on and off of the thin film transistor, and at the same time controls signal storage and output of the reference charge register and the signal charge register.

4. The X-ray image sensor according to claim 3, wherein:
   the X-ray image sensor further has a multiple signal output selecting switch, the multiple signal output selecting switch is controlled by the row driving control circuit, and charges on different pixels are discharged to the same signal output line through switching of the switch.

5. The X-ray image sensor according to claim 4, wherein:
   the row driving control circuit is adhered to a glass substrate, the multiple signal output selecting switch is integrated in the row driving control circuit, and row driving signal lines are fabricated to be connected to fingerlike row driving electrodes receiving inputs from the row driving control circuit.

6. The X-ray image sensor according to claim 1, wherein:
   the charge readout circuits are distributed on left and right sides of the X-ray image sensor, and the charge readout circuits on each side are only connected to ½ of a total number of rows of the pixels.

7. An X-ray image detection device, comprising a scintillator for converting an X-ray into a visible light, and a data integration processing unit, wherein:
   the X-ray image detection device further comprises a plurality of the X-ray image sensors according to claim 1, and the X-ray image sensors are arranged in a matrix form; and
   the scintillator is directly opposite to an X-ray source, the X-ray image sensors arranged in the matrix form are located on the back of the scintillator, and the data integration processing unit is connected to the X-ray image sensors.

8. The X-ray image detection device according to claim 7, wherein:
   the X-ray image detection device further comprises an X-ray dose sensor, and the X-ray dose sensor is located on the back of the X-ray image sensor.

9. The X-ray image detection device according to claim 8, wherein:
   the X-ray dose sensor generates a feedback signal through an X-ray dose feedback output unit, and the feedback signal is provided to the X-ray source.

10. The X-ray image detection device according to claim 8, wherein:
    the X-ray image detection device is activated at the moment when the X-ray dose sensor starts to accumulate charges, and the pixel charge accumulation of the X-ray image detection device is ended at the moment when the X-ray dose sensor meets dose requirements.

11. The X-ray image detection device according to claim 7, wherein:
    the X-ray image detection device further comprises an anti-scatter grid, the anti-scatter grid is directly opposite to the X-ray source, and the scintillator is located on the back of the anti-scatter grid.

12. The X-ray image detection device according to claim 11, wherein:
    the anti-scatter grid is replaced by a virtual grid.

13. The X-ray image sensor according to claim 1, wherein:
    the two thin film transistors contained in each pixel are adjacent to each other in a same row.

* * * * *